United States Patent [19]

Cass et al.

[11] 3,844,831

[45] Oct. 29, 1974

[54] FORMING A COMPACT MULTILEVEL INTERCONNECTION METALLURGY SYSTEM FOR SEMI-CONDUCTOR DEVICES

[75] Inventors: Eugene E. Cass, Hopewell Junction; William A. Enichen, Wappingers Falls; Janos Havas, Hopewell Junction, all of N.Y.

[73] Assignee: International Business Machines Corporation, Armonk, N.Y.

[22] Filed: Oct. 27, 1972

[21] Appl. No.: 301,570

[52] U.S. Cl. .................... 117/212, 174/68.5, 156/3, 117/217

[51] Int. Cl. .......................... B44d 1/18, B32b 31/14

[58] Field of Search .................... 117/212, 215, 217; 174/68.5; 156/3, 7

[56] References Cited

UNITED STATES PATENTS

| | | | |
|---|---|---|---|
| 3,406,043 | 10/1968 | Balde | 117/212 |
| 3,597,667 | 8/1971 | Horn | 117/215 |
| 3,760,242 | 9/1973 | Duffy | 117/212 |

*Primary Examiner*—John D. Welsh
*Attorney, Agent, or Firm*—Wolmar J. Stoffel

[57] ABSTRACT

In this method, the multi-level interconnection metallurgy system is made more compact by eliminating the need for pads normally associated with via connections between the metallurgy layers. The method consists of forming a first dielectric layer on a semiconductor substrate, forming the first interconnection metallurgy level on the first layer, depositing a second dielectric layer over the metallurgy layer wherein the second dielectric layer is a material different from the material of the first dielectric layer, forming via holes in the second dielectric layer of a diameter substantially equal to or larger than the width of the underlying interconnection lines of the first metallurgy pattern, and forming a second interconnection metallurgy system over the second dielectric layer with the conductive lines of the second metallurgy layer having a uniform width over the via holes.

14 Claims, 7 Drawing Figures

FORMING A COMPACT MULTILEVEL INTERCONNECTION METALLURGY SYSTEM FOR SEMI-CONDUCTOR DEVICES

BACKGROUND OF THE INVENTION

1. Field of the Invention

This invention relates to the fabrication of semiconductor devices and, more particularly, to the fabrication of improved interconnection metallurgy systems for semiconductor devices that permits a more dense interconnection metallurgy pattern.

2. Description of the Prior Art

In modern semiconductor device technology, increasing numbers of devices and circuits are being put on a single chip which requires increased microminiaturization of semiconductor elements and the interconnection metallurgy system connecting the elements into circuits. The objective is to decrease costs and improve performance of integrated circuit devices. The move toward miniaturization is constantly crowding fabrication technology, particularly photolithographic and etching techniques.

An important application to integrated circuit devices is logic and storage functions for computers. In integrated circuit devices specifically designed for carrying out logic functions, the device is conventionally fabricated on a master slice which is a small piece of semiconductor material, typically silicon, approximately one-eighth of an inch square, having thousands of diffusions capable of being connected together to form various circuits. The individual devices are connected into circuits and to input-output terminals by a complex interconnection metallurgy system commonly employing two or three separate levels of circuitry separated by dielectric layers of material. Conventionally, the first interconnecting metallurgy layer of the logic device interconnects the devices, both active and passive, into circuits and also provides a plane for introducing the circuits to circuit communications. The latter function usually consists of parallel lines connected to the individual circuits. The second layer conventionally completes the circuit-to-circuit connection and makes contact to terminals which are connectable to a support such as a module substrate or card. The second level usually consists primarily of parallel lines that are transverse to the aforementioned parallel lines of the underlying interconnection metallurgy level. In logic devices, the support area for the metallurgy is the primary factor in determining its size. The area occupied by the actual active and passive semiconductor devices utilized in the various circuits occupies a small amount of total area of the chip. At the present state of technology, the lower limits of the width of an interconnection metallurgy stripe are imposed primarily by the photolithographic technology. The line widths are on the order of 0.15 mils with a separation on the order of 0.15 mils for long lines. However, it is conventional to provide via pads in each interconnection metallurgy layer for making connection between the metallurgy layers. The via pads on the underlying metallurgy layer are provided to prevent etching through the dielectric layer underlying the first level metallurgy when making via holes through the overlying second dielectric layer. If the pads are not provided, any misalignment of the mask forming the via holes would result in etching directly through the second overlying layer and also possibly the underlying dielectric layer. A pad is provided on the second overlying metallurgy layer to prevent etching the underlying metallurgy stripe during subtractive etching of the upper layer. If the pad was not provided and a misalignment of the stripe over the via hole occurred, the etchant might etch away and break the conductive line in the lower underlying metallurgy system.

However, the use of pads in a conductive interconnection metallurgy system about the via connections materially restricts the density of the system. In designing the system, it is ordinarily necessary to provide for the possibility of locating two via holes in adjacent parallel lines in side by side relation. Photolithographic and masking technology requires that the diameter of the via hole at the top of the dielectric surface be at least 0.25 mils. The pad must overlap the via hole by at least 0.15 mils or a sharp pointed upwardly extending lip occurs about the via hole which is detrimental to mask life and is also difficult to deposit a layer of metal or glass over same. This requires that the pads have a diameter of 0.55 mils. Adjacent pads must be located at least 0.2 mils apart. Thus, the minimum center-to-center spacings between two parallel adjacent conductive stripes is of the order of 0.75 mils. In contrast, in a system that didn't require pads over the via holes, the stripes could be spaced at 0.45 mils center-to-center distance.

As is believed evident, the use of pads in a multilevel interconnection metallurgy system as practiced by the prior art, provides a severe constraint when attempts are made to increase the density of the metallurgy circuitry on a semiconductor device.

SUMMARY OF THE INVENTION

An object of this invention is to provide a new method for fabricating a multi-level interconnection metallurgy system for integrated semiconductor devices.

Another object of this invention is to provide a new method for fabricating multi-level interconnection metallurgy systems which permits greater circuit densities.

Another object of this invention is to provide a new method for fabricating multi-level interconnection metallurgy systems wherein the possibility of forming sharp projections on the passivating glass layer surfaces is minimized.

Yet another object of this invention is to provide a method of fabricating multi-level interconnection metallurgy systems without utilizing via pads.

These and other objects of the invention are achieved in the method of the invention wherein a first layer of dielectric material is deposited on the surface of the semiconductor substrate, a first layer of metal deposited and formed into an interconnection metallurgy system by selective removal of portions of the layer of metal, a second dielectric layer deposited over the first metallurgy layer and underlying dielectric layer, which material of the second dielectric layer is dissimilar from the material of the first dielectric layer, forming via holes in the second dielectric layer of a diameter substantially equal to or larger than the width of the underlying conductive lines of the first metallurgy pattern using an etchant that is selective to the material of the second dielectric layer, forming a second metallurgy layer over the first dielectric layer wherein the second metallurgy layer has uniform width lines over the via holes.

BRIEF DESCRIPTION OF THE DRAWINGS

The foregoing and other objects, features and advantages of the invention will be apparent from the following more particular description of preferred embodiments of the invention as illustrated in the accompanying drawings.

DESCRIPTION OF THE PREFERRED EMBODIMENTS

Figure 1A:
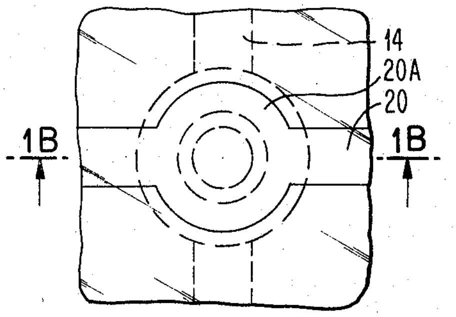
PRIOR ART FIG. 1A
FIG. 1A is a top plan view illustrating via pad structure of interconnection metallurgy systems as practiced in the prior art.
Figure 1B:
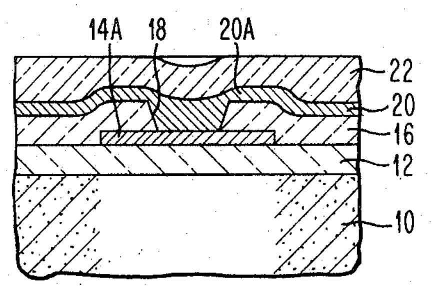
PRIOR ART FIG. 1B
FIG. 1B is an elevational view in cross-section taken on line 1B of FIG. 1A.

Referring to the drawings, there is shown in FIGS. 1A and 1B a via connection typical of the prior art between two layers of interconnection metallurgy. Substrate 10 is a semiconductor body having embodied therein various diffusions which form active and passive devices. Body 10, as best shown in FIG. 1A, is covered with a passivating layer 12 typically thermal $SiO_2$. A first metallurgy layer 14 rests on layer 12 and makes contact to the various devices in body 10 through openings not shown. A second overlying passivating layer 16 is deposited over metallurgy layer 14 and contains openings 18, commonly referred to as via holes. A second metallurgy level 20 is deposited over dielectric layer 16 and extends through via hole 18 to make contact with the underlying metallurgy layer 14. A third passivating layer 22 is deposited over second level metallurgy layer 20. In practice, additional metallurgy layers can be deposited which are separated by dielectric layers containing via holes for establishing contact between the various layers. As is best shown in FIG. 1A, it is a common practice in the prior art to provide enlarged portions in each of the stripes, commonly referred to as via pads, about and below the via hole 18. These pads are shown in FIG. 1 by 14A as the via pad of the lower level metallurgy 14 and 20A as the via pad on the upper level metallurgy 20. In prior art metallurgy systems, pads are provided to minimize the effect of minor mask misalignment. Pad 14A in the first metallurgy level is provided so that in the event of a mask misalignment in forming the via hole, the etchant for etching through the first passivating layer 16 would not continue to etch through the underlying passivating layer 12. This is a possibility when the via hole is not directly over the lower stripe. The lower via pad 14A acts therefore as an etchant stop. The upper via pad 20A is provided so that in the event the stripe 20 is not directly over and covering the entire via hole, the etchant used in subtractive etching the blanket metal layer will not cut the underlying first level metallurgy stripe 14. The diameter of the via pads in the metallurgy stripes must be significantly larger than the width of the stripe even though the misalignment probability may be relatively small. When the via pad is not sufficiently large, a sharp lip is formed in the dielectric layer which is very detrimental to mask life. There is thus a minimum radial width between the via hole and the overlapping edge of the pad which must be maintained to prevent forming the sharp lip in the overlying passivating layer.

In general, the aspect limiting the size of an integrated circuit device is the space required for supporting the necessary interconnection metallurgy circuitry. It can easily be seen that when parallel lines contain via pads, the spacing must be significantly increased. Further, in designing the metallurgy circuitry it must be designed to accommodate the possibility of two pads on adjacent parallel stripes occurring in side-by-side relation.

Figure 2:
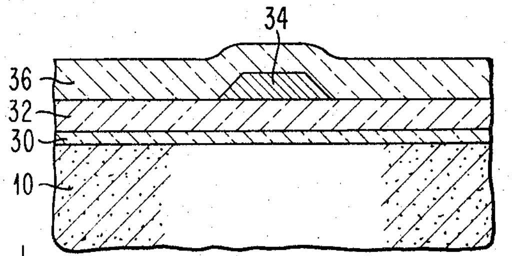
FIGS. 2 through 5 show a sequence of elevational views in broken cross-section of a multi-level interconnection metallurgy system illustrating the steps of the subject invention.

Referring now to FIGS. 2 through 5, there is illustrated a sequence of cross-sectional views illustrating the process of the invention for forming a more dense metallurgy system through the elimination of via pads. FIG. 2 shows a typical semiconductor substrate 10 having a surface passivating layer. Preferably, the passivating layer overlying the surface of device 10 consists of a lower layer 30 of thermal $SiO_2$ and an overlying layer 32 of $Si_3N_4$. Deposited on the surface of layer 32 is a first interconnection metallurgy layer 34 formed by conventional fabrication techniques. FIG. 2 illustrates only a single stripe of an interconnection metallurgy layer which stripe extends longitudinally in a direction transverse to the plane of the drawing. Metallurgy layer 34 can be fabricated by any suitable technique, as for example, masking with a resist and subtractive etching, masking and sputter etching, or by lift-off techniques, known to the prior art. A significant aspect of the metallurgy system 34 is that no via pads are provided under the via openings. Subsequently, a second dielectric layer 36 is deposited over first metallurgy layer 34 and a via hole 38 made through layer 36 over the stripe 34. Opening 38 is made by conventional photolithographic techniques and subtractive etching. An important aspect of this invention is providing dissimilar materials for layers 32 and 36. The etchant used for forming via opening 38 in layer 36 must not significantly affect the material of layer 32. A suitable combination of such layers is layer 32 of $Si_3N_4$ and layer 36 of $SiO_2$. An etchant for $SiO_2$, which is typically hydrofluoric acid buffered with ammonium fluoride, does not significantly affect silicon nitride. Thus, a mask misalignment which results in exposing the lower layer to the etchant of the upper layer will not result in openings in the lower layer. Alternately, the materials of the two layers could be reversed with layer 36 being silicon nitride, which could be etched by hot ammonium dihydrogen phosphate at 200°C. While this etchant affects $SiO_2$, it does not do so at a significant rate. Other combinations of layers are $Al_2O_3$ for the first dielectric layer and the second layer formed of $SiO_2$. The etchant for $SiO_2$, i.e., a buffered HF solution, does not significantly affect $Al_2O_3$. Still, another combination is forming the first dielectric layer of thermal oxide, and the second dielectric layer of pyrolytically deposited $SiO_2$ at relatively low temperatures of the range of 400°–550°C. The pyrolytically deposited layer of $SiO_2$ etches at a very significantly higher rate than the $SiO_2$ layer formed by thermal oxidation. It can be seen that when utilizing a combination of layers of dielectric material such that the lower layer is not significantly affected by the upper layer etchant, that misalignments of the mask for forming the via holes will not cause the etchant to etch through the lower layer down potentially to the substrate thereby causing a short.

Figure 4:
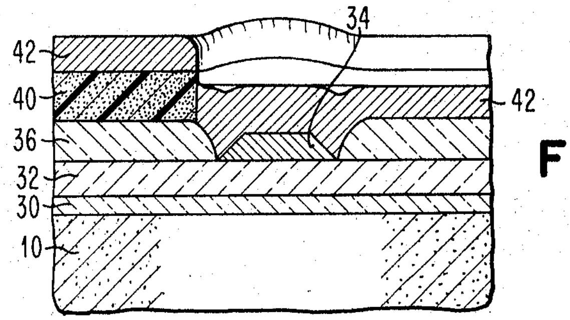
Figure 5:
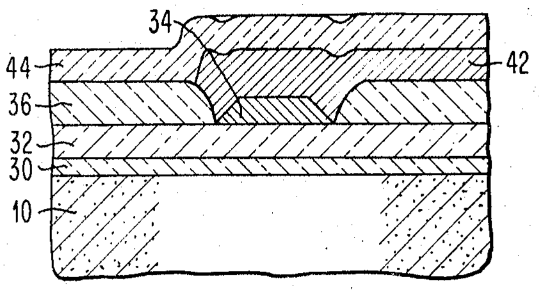

As indicated in FIG. 4, when the upper or overlying level metallurgy is similar to the lower or underlying metallurgy level 34, the upper level interconnection metallurgy system is fabricated preferably by a lift-off technique. To accomplish this, a layer of photoresist 40 is deposited on the surface of dielectric layer 36 after via holes 38 have been formed, and the resist exposed and developed to form a reverse pattern of the desired second level metallurgy. A blanket layer 42 of metal is then deposited over the surface of the resultant substrate as shown in FIG. 4. Where portions of the resist layer 40 have been removed, the layer of metal 42 is in direct contact with the dielectric layer 36 and the first level metallurgy 34 through the via hole 38. Subsequently, the substrate is exposed to a resist solvent which removes the layer 40 and all the overlying portions of metal layer 42. By this technique, the second level metallurgy 42 can be fabricated without exposing the first level metallurgy 34 to an etchant which significantly affects same. Any slight misalignment of the mask for forming the upper interconnection metallurgy pattern will have no adverse affect on the underlying metallurgy. Any suitable type of resist can be utilized including organic photoresists and metals, such as aluminum. When the first and second metallurgy levels are of aluminum, obviously aluminum cannot be used as a resist. However, there are other types of metals which are dissimilar and which can be utilized. As shown in FIG. 5, a third dielectric layer 44 is deposited over the second level metallurgy interconnection pattern 42 and dielectric layer 36. If necessary or desirable, the same basic procedures could be utilized to form a third level of metal.

Figure 3A:
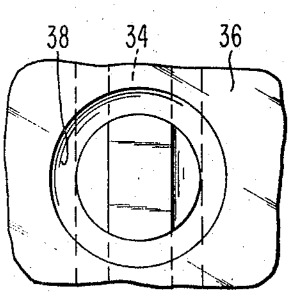
Figure 3:
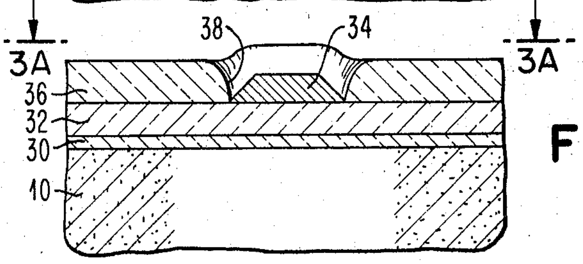

As illustrated best in FIG. 3A, the first level metallurgy conductive pattern 34 does not employ via pads as is common in the prior art as illustrated in FIGS. 1A and 1B. Likewise, in the second level metallurgy conductive pattern, the stripe can have substantially the same or slightly greater width than the diameter of the via hole. When lift-off techniques are used to form the second or upper level metallurgy interconnection system, a misalignment of the mask will not affect the underlying layer even though a portion of the underlying first level metallurgy system may be exposed. The same situation would very likely result in an "open" line if subtractive etching techniques were utilized.

In the preferred embodiment illustrated in FIGS. 2 through 5, both first and second metallurgy interconnection patterns are formed of aluminum, or aluminum alloys such as aluminum-copper, aluminum-silicon (as described in U.S. Pat. No. 3,382,568), or aluminum-copper-silicon. However, other metals or composite laminated metal layers such as Cr-Ag-Cr, Cr-Cu-Cr (as disclosed in U.S. Pat. No. 3,461,357), or Ta-Au-Ta (as disclosed in U.S. Pat. No. 3,617,816), and the like, could be utilized.

A modification of the aforedescribed process consists of utilizing in the second underlying metallurgy layer a metal or combination of metals dissimilar from the first metal interconnection metal. When this condition exists and an etchant is provided which affects only the upper level of metal, any misalignment of the mask which may leave exposed a portion of the lower level metal in the via holes would not result in an "open" when subtractive etchant was used to fabricate the second metallurgy level. Various combinations of metals for the metallurgy system exist. For example, the lower first metallurgy level can be formed of a composite laminated layer consisting of a layer of silver sandwiched between layers of chromium, and the second overlying metallurgy layer formed of aluminum or aluminum alloys. The aluminum etchant used for subtractively etching the upper overlying metallurgy layer must be an etchant which does not materially affect chromium or silver. A suitable etchant for aluminum is a solution of hydrogen peroxide and ammonium fluoride. Another combination of metallurgies is a lower composite layer consisting of a layer of copper sandwiched between layers of chromium, and an overlying second level metallurgy of aluminum or aluminum alloys. The same aluminum etch described previously does not significantly affect copper. Another example of a metallurgy combination is a first lower composite layer consisting of a layer of gold sandwiched between layers of tantalum, and an overlying second metallurgy level consisting of a layer of silver sandwiched between layers of chromium. Suitable chromium and silver etchants are chromate etchants and ferric chloride solutions for gold and potassium permanganate solutions, and potassium ferric cyanide solutions for chromium, which will be used to fabricate the upper level since they do not significantly affect the lower tantalum and gold layers. The tantalum and gold layers of the first level are preferably formed by sputter etching. Another combination of metals suitable for use in the method of the invention is a lower first level composite layer of gold sandwiched between layers of tantalum, and a second overlying layer of copper sandwiched between layers of chromium.

The important aspect of the aforedescribed embodiments is that the two metallurgies be dissimilar and that an etchant be used on the upper level of metal in a subtractive etching process whereby the lower metallurgy level is not affected by the etchants for the upper metals in the event that there is a misalignment of masks which might leave a portion of the lower metallurgy level exposed through the via opening.

Although the invention has been particularly shown and described with reference to the preferred embodiments thereof, it will be understood by those skilled in the art that the foregoing and other changes in form and details may be made therein without departing from the spirit and scope of the invention.

What is claimed is:

1. A method of fabricating a multi-level interconnection metallurgy system for an integrated semiconductor device comprising
   - forming a first dielectric layer on the surface of a semiconductor substrate,
   - forming a first layer of first metal on said first dielectric layer,
   - forming a first metallurgy interconnection pattern having uniform width stripes in the first layer of metal by selective removal of portions thereof,
   - depositing a second dielectric layer over the first metallurgy layer of said first dielectric layer, said second dielectric layer of a material dissimilar from said first dielectric layer,
   - forming via holes in said second dielectric layer of a diameter substantially equal to or larger than the width of the underlying conductive lines of the first metallurgy pattern using an etchant that is selective to the material of the second dielectric layer, forming a second metallurgy layer of a second metal having dissimilar etching characteristics than said first metal over the second dielectric layer, and forming an interconnection pattern in the second metallurgy layer with uniform width lines over the via holes using an etchant selective to said second metal.

2. The method of claim 1 wherein said first dielectric layer is formed of $Si_3N_4$ and said second dielectric layer is formed of $SiO_2$.

3. The method of claim 1 wherein said first dielectric layer is formed of $Al_2O_3$, and said second dielectric layer is formed of $SiO_2$.

4. The method of claim 1 wherein said semiconductor substrate is silicon, said first dielectric layer is formed by thermal oxidation of said silicon substrate, and said second dielectric layer is formed by pyrolytically depositing a layer of $SiO_2$ at relatively low temperatures in the range of 400°–550°C.

5. A method of fabricating a multi-level interconnection metallurgy system for an integrated semiconductor device comprising forming a first dielectric layer on the surface of a semiconductor substrate, forming a first layer of metal on said first dielectric layer, forming a first metallurgy interconnection pattern having uniform width lines in the first layer of metal by selective removal of portions thereof, depositing a second dielectric layer over the first metallurgy layer and said first dielectric layer, said second dielectric layer of a material dissimilar from said first dielectric layer, forming via holes in said second dielectric layer of a diameter substantially equal to or larger than the width of the underlying conductive lines of the first metallurgy pattern using an etchant that is selective to the material of the second dielectric layer, forming a second metallurgy interconnection layer with uniform width lines on said second dielectric layer over the via holes by depositing a resist layer on the second dielectric layer, forming a reverse pattern of the interconnection pattern in the resist layer, depositing a blanket second metal layer on the resist layer and exposed portions of the second dielectric layer, subjecting the substrate to an etchant that removes the resist layer thereby removing the resist layer and the overlying portions of the second metal layer but leaving the portions of the metal layer adherent to the second dielectric layer that constitute the second metallurgy interconnection layer.

6. The method of claim 5 wherein the first and second metallurgy layers are of a similar metal.

7. The method of claim 5 wherein the first and second metallurgy layers are selected from the group consisting of aluminum and aluminum alloys.

8. The method of claim 5 wherein said resist layer is aluminum.

9. The method of claim 1 wherein said first layer of metal is formed of Ag, sandwiched between layers of Cr, and said second layer of metal is formed of a metal selected from the group consisting of Al and Al alloys.

10. The method of claim 1 wherein said first layer of metal is formed by depositing an initial layer of Cr, an intermediate layer of Cu, and a top layer of Cr, and said second metal layer is formed of a metal selected from the group consisting of Al and Al alloys.

11. The method of claim 1 wherein said first layer of metal is formed by depositing an initial layer of Ta, an intermediate layer of Au, and a top layer of Ta, and said second layer of metal is formed by depositing an initial layer of Cr, an intermediate layer of Ag, and a top layer of Cr.

12. The method of claim 1 wherein said first layer of metal is formed by depositing an initial layer of Ta, an intermediate layer of Au, and a top layer of Ta, and said second layer of metal is formed by depositing an initial layer of Cr, an intermediate layer of Cu, and a top layer of Cr.

13. The method of claim 1 wherein said first layer of metal is formed by depositing an initial layer of Cr, an intermediate layer of Ag, and a top layer of Cr, and said second layer of metal is formed by depositing a layer of Al.

14. The method of claim 1 wherein said second metal layer is formed of a metal dissimilar from the metal of said first metal layer, and said second metal layer is subtractively etched with an etchant that does not materially affect the metal of said first metal layer.

* * * * *